(12) United States Patent
Chen

(10) Patent No.: US 7,018,782 B2
(45) Date of Patent: Mar. 28, 2006

(54) METHOD FOR MANUFACTURING A LIGHT GUIDE PLATE MOLD

(75) Inventor: Ga-Lane Chen, Fremont, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/898,394

(22) Filed: Jul. 23, 2004

(65) Prior Publication Data

US 2005/0019701 A1  Jan. 27, 2005

(30) Foreign Application Priority Data

Jul. 23, 2003  (TW) .................................. 92120071

(51) Int. Cl.
*G02F 1/1335* (2006.01)

(52) U.S. Cl. ...................... 430/320; 430/296; 430/321; 430/945; 216/11; 216/24

(58) Field of Classification Search ................ 430/320, 430/321, 296, 945; 264/2.5; 216/11, 24
See application file for complete search history.

(56) References Cited

U.S. PATENT DOCUMENTS

2003/0031116 A1* 2/2003 Takeda et al. .............. 369/283
2003/0086030 A1* 5/2003 Tnaiguchi et al. ............ 349/61

* cited by examiner

*Primary Examiner*—Joan A. McPherson
(74) *Attorney, Agent, or Firm*—Wei Te Chung

(57) ABSTRACT

A method for manufacturing a light guide plate mold includes the following steps: providing a substrate (20); coating a photo resist layer (21) on the substrate; exposing the photo resist layer to illuminating light (26) emitted by a light source (22); developing the photo resist layer; and etching the substrate to obtain the light guide plate mold. The illuminating light emitted from the light source has a predetermined distribution of intensity. The light guide plate mold is formed with high precision and accuracy.

14 Claims, 2 Drawing Sheets

US 7,018,782 B2

METHOD FOR MANUFACTURING A LIGHT GUIDE PLATE MOLD

BACKGROUND OF THE INVENTION

1. Field of the Invention

The present invention relates to a method for manufacturing a mold, and especially to a method for manufacturing a light guide plate mold using lithography technology.

2. Description of the Prior Art

A common type of liquid crystal panel needs a backlight module to provide uniform light and clear viewing of displayed images. A backlight module usually consists of a light source, a light guide plate, and a reflective plate. Light emitted from the light source is directed into the light guide plate, and is guided by the light guide plate and the reflective plate to emit from an emitting surface of the light guide plate. Then the light enters a diffuser, and the diffuser diffuses the light to provide uniform luminance for the liquid crystal panel. Usually, in order to attain uniform emitting light, some special optical structures are disposed on a bottom surface of the light guide plate to disperse what would otherwise be single internal reflections. The bottom surface is opposite to the emitting surface, and the optical structures are typically scattering dots.

Nowadays, manufacturing methods for a light guide plate are classified into two types: printing methods and non-printing methods. The printing method includes the following steps: printing some printing materials on a bottom surface of a light guide plate substrate, the printing materials being doped with highly diffusive materials such as $SiO_2$ and $TiO_2$; and heating and curing the printing materials. The diffusing materials are used to disperse what would otherwise be single internal reflections of incident light in the light guide plate. That is, the diffusing materials help scatter light before it is transmitted from the emitting surface, thereby providing uniform luminance for a liquid crystal panel.

The non-printing method includes the following steps: forming specific patterns on a surface of a light guide plate mold; injecting molten Polymethyl Methacrylate (PMMA) into the mold; and cooling the mold to obtain a light guide plate having desired specific patterns. The patterns are formed without any heating of a preform of the light guide plate. Thus the non-printing method has the benefit of lower cost.

In non-printing methods, mechanical tooling processes and lithography processes can be used to form the mold. Referring to FIGS. 7 to 11, a conventional lithography process is as follows:

1) sputtering a thin film 11 on a substrate 10, and coating a photo resist layer 12 on the thin film 11;
2) disposing a mask 13 having a predetermined pattern over the substrate 10, and exposing the photo resist layer 12 to a light source 14 emitting light passing through the mask 13;
3) developing the photo resist layer 12, and washing out a bare portion of the thin film 11 by using an erosive solution; and
4) stripping the residual photo resist layer 12 to form a pattern on the thin film 11, the pattern corresponding to that of the mask 13.

Typically, the foregoing steps are repeated to produce a complex pattern on a light guide plate mold. The more complex the pattern is, the more repeats are needed, and the more masks having different patterns are needed. In particular, each of the masks has a tolerance, and the tolerances of the masks result in so-called "interferences" between the patterns of masks. That is, the precision and accuracy of the final pattern of the light guide plate mold is diminished. In addition, it is difficult to precisely control the results of washing out of the bare portions of the thin film by he erosive solution.

SUMMARY OF THE INVENTION

An object of the present invention is to provide a method for manufacturing a light guide plate mold which provides a precise and accurate light guide plate mold and which is inexpensive.

To achieve the above object, a method for manufacturing a light guide plate mold includes the following steps: providing a substrate; coating a photo resist layer on the substrate; exposing the photo resist layer to illuminating light emitted by a light source; developing the photo resist layer; and etching the substrate to obtain the light guide plate mold. The illuminating light has a predetermined distribution of intensity. Therefore the light guide plate mold is formed with high precision and accuracy.

Other objects, advantages and novel features of the present invention will be apparent from the following detailed description of preferred embodiments thereof with reference to the attached drawings, in which:

DETAILED DESCRIPTION OF THE PRESENT INVENTION

References will now be made to the drawings to describe the present invention in detail.

Referring to FIGS. 1 to 6, a method of manufacturing a light guide plate mold includes steps as follows:

1) providing a substrate 20;
2) coating a photo resist layer 21 on the substrate 20;

3) exposing the photo resist layer 21 to a light source 22;

4) developing the exposed photo resist layer 21; and 5) etching the substrate 20 to form a light guide plate mold 25.

Figure 1:
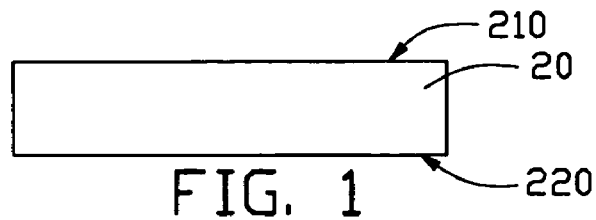
FIG. 1 shows a step of providing a substrate in a method for manufacturing a light guide plate mold in accordance with the present invention.

Referring to FIG. 1, the substrate 20 has a top surface 210 and a bottom surface 220. The top surface 210 is preferably flat, but may have any other particular configuration according to the particular light guide plate mold desired. The substrate 20 is usually made of metal, such as nickel, which has a high hardness and is durable.

Figure 2:
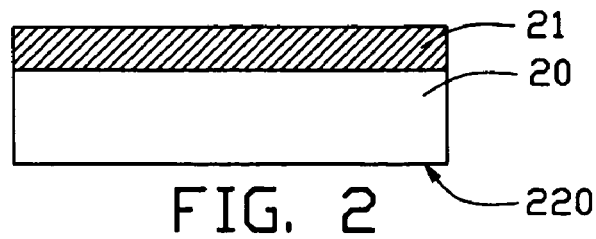
FIG. 2 shows a step of coating a photo resist layer on the substrate in accordance with said manufacturing method.

Referring to FIG. 2, the coating step can be divided into three sub-steps as follows: depositing photo resist materials on the top surface 210 of the substrate 20; rotating the substrate 20 around its center until the photo resist materials are uniformly distributed, thereby forming the photo resist layer 21; and cleaning away excess photo resist materials at a periphery of the substrate 20.

Figure 3:
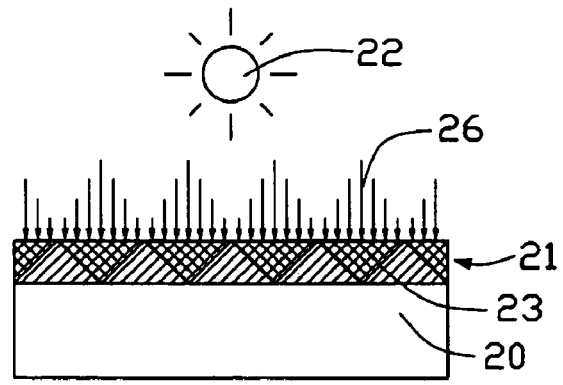
FIG. 3 shows a step of exposing the photo resist layer in accordance with said manufacturing method.
Figure 6:
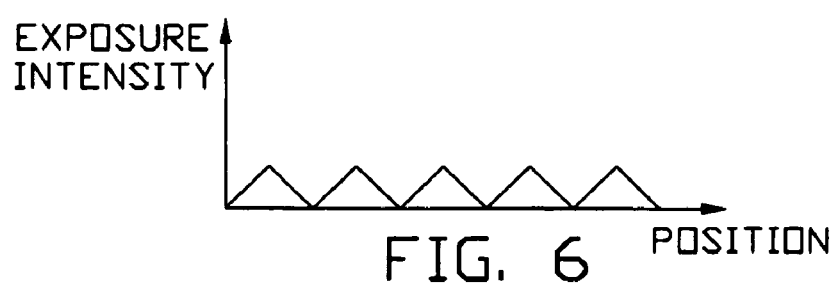
FIG. 6 is a graph illustrating the relationship between distribution of intensity of light exposure and position on the photo resist layer.
Figure 7:
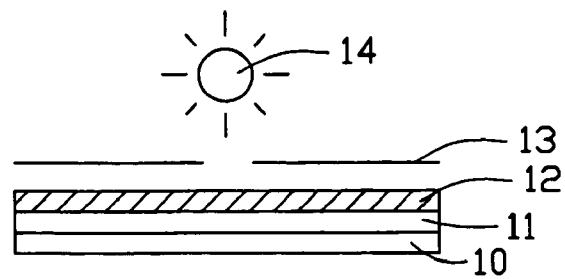
FIG. 7 shows a step of coating a photo resist layer on a substrate in a conventional method for manufacturing a light guide plate mold.
Figure 8:
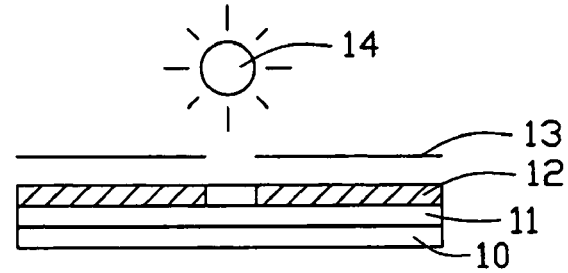
FIG. 8 shows a step of exposing the photo resist layer in accordance with said conventional manufacturing method.
Figure 9:
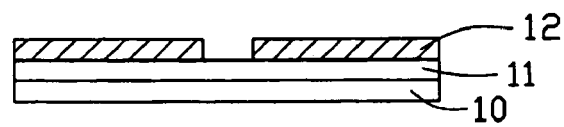
FIG. 9 shows a step of developing the exposed photo resist layer in accordance with said conventional manufacturing method.
Figure 10:
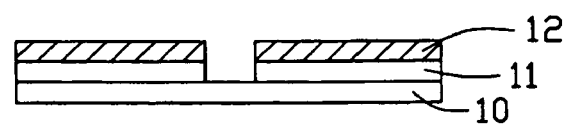
FIG. 10 shows a step of etching the substrate in accordance with said conventional manufacturing method.
Figure 11:
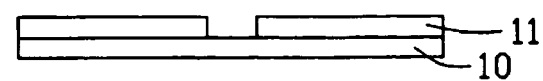
FIG. 11 shows a process of stripping the residual photo resist layer in accordance with said conventional manufacturing method.

Referring to FIG. 3, the photo resist layer 21 is exposed to light beams 26 emitted from the light source 22. The light beams 26 can be laser beams or electron beams. In order to attain different exposure depth levels on the photo resist layer 21, the intensities of the light beams 26 are controlled as shown in FIG. 6. That is, the varying intensities can be represented by triangular or sawtooth waves. Therefore, the exposed portion of the photo resist layer 21 defines patterns 23 accordingly.

Figure 4:
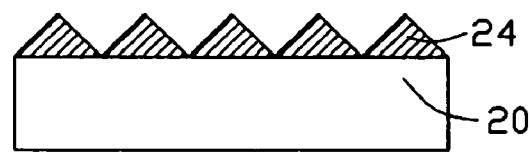
FIG. 4 shows a step of developing the exposed photo resist layer in accordance with said manufacturing method.

Referring to FIG. 4, after the developing step, the patterns 23 are washed out, and patterns 24 of the residual photo resist layer 21 are thus formed on the substrate 20. The patterns 24 comprise a plurality of V-shaped grooves.

Figure 5:
FIG. 5 shows a step of etching the substrate in accordance with said manufacturing method.

Referring to FIG. 5, the etching step is performed by dry etching such as the plasma etching. The substrate 20 and the patterns 24 are etched simultaneously to provide the light guide plate mold 25 with the plurality of V-shaped grooves according to the patterns 24. The V-shaped grooves commonly have a trough angle of 95 to 115 degrees.

In order to attain the desired patterns 23, the exposing step of the foregoing method is performed merely by controlling the intensity of the light beams 26. Unlike in the prior art, masks having predetermined patterns are not needed, and the problem of interferences between masks is eliminated. As a result, the light guide plate mold is formed with high precision and accuracy.

While the present invention has been described with reference to particular embodiments, the description is illustrative of the invention and is not to be construed as limiting the invention. Therefore, various modifications of the described embodiments can be made by those skilled in the art without departing from the true spirit and scope of the invention as defined by the appended claims.

What I claim is:

1. A method for manufacturing a light guide plate mold, comprising the following steps:
    providing a substrate;
    coating a photo resist layer on the substrate;
    exposing the photo resist layer to illuminating light emitted by a light source;
    developing the photo resist layer; and
    etching the substrate to obtain the light guide plate mold;
    wherein the illuminating light has a predetermined distribution of intensity, and the predetermined intensity distribution can be represented by a triangular wave or a sawtooth wave.

2. The method of claim 1, wherein the substrate comprises nickel.

3. The method of claim 1, wherein vertex angles of the triangular wave or the sawtooth wave are in the range from 95 to 115 degrees.

4. The method of claim 1, wherein the etching is dry etching.

5. The method of claim 4, wherein the dry etching is plasma etching.

6. The method of claim 1, wherein the illuminating light comprises laser beams.

7. The method of claim 1, wherein the illuminating light comprises electron beams.

8. A method for manufacturing a light guide plate mold, comprising the following steps:
    providing a substrate;
    coating a photo resist layer on the substrate;
    applying illuminating light with different intensities to different areas of the photo resist layer to pattern the photo resist layer, wherein a predetermined intensity distribution of the illuminating light can be represented by a triangular wave or a sawtooth wave; and
    etching the substrate according to the patterned photo resist layer to obtain the light guide plate mold having a corresponding pattern thereon.

9. The method of claim 8, wherein the substrate comprises nickel.

10. The method of claim 9, wherein vertex angles of the triangular wave or the sawtooth wave are in the range from 95 to 115 degrees.

11. The method of claim 8, wherein the etching is dry etching.

12. The method of claim 11, wherein the dry etching is plasma etching.

13. The method of claim 8, wherein the illuminating light comprises laser beams.

14. The method of claim 8, wherein the illuminating light comprises electron beams.

* * * * *